(12) United States Patent
La et al.

(10) Patent No.: US 8,043,525 B2
(45) Date of Patent: Oct. 25, 2011

(54) WET ETCHING SOLUTION

(75) Inventors: Jung In La, Asan-si (KR); Myung Kook Park, Gumi-si (KR); Ho Seok Yang, Daejeon (KR)

(73) Assignee: Cheil Industries, Inc., Gumi-si, Gyeongsangbuk-do (KR)

( * ) Notice: Subject to any disclaimer, the term of this patent is extended or adjusted under 35 U.S.C. 154(b) by 1055 days.

(21) Appl. No.: 11/892,076

(22) Filed: Aug. 20, 2007

(65) Prior Publication Data

US 2008/0041823 A1 Feb. 21, 2008

(30) Foreign Application Priority Data

Aug. 21, 2006 (KR) .................. 10-2006-0078818

(51) Int. Cl.
*C09K 13/00* (2006.01)
(52) U.S. Cl. ............... 252/79.1; 252/79.2; 252/79.3; 252/79.4
(58) Field of Classification Search ............ 252/79.1, 252/79.2, 79.3, 79.4
See application file for complete search history.

(56) References Cited

U.S. PATENT DOCUMENTS

| 6,140,233 A | 10/2000 | Kwag et al. | |
|---|---|---|---|
| 6,399,552 B1 * | 6/2002 | Lee et al. | 510/175 |
| 2005/0118440 A1 * | 6/2005 | Mahon et al. | 428/469 |
| 2006/0183297 A1 * | 8/2006 | Mun et al. | 438/459 |

FOREIGN PATENT DOCUMENTS

| EP | 1168424 A1 * | 1/2002 |
|---|---|---|
| JP | 59219472 A * | 12/1984 |
| KR | 10-2000-0004840 | 1/2000 |

OTHER PUBLICATIONS

Wikipedia, The Free Encyclopedia, "Ammonium Lauryl Sulfate"; http://en.wikipedia.org/wiki/Ammonium_lauryl_sulfate ; 3 pages; Sep. 2010.*

* cited by examiner

*Primary Examiner* — Binh X Tran
(74) *Attorney, Agent, or Firm* — Lee & Morse, P.C.

(57) ABSTRACT

A wet etching solution includes hydrogen fluoride in an amount of about 0.1% to about 3% by weight of the etching solution, an inorganic acid in an amount of about 10% to about 40% by weight of the etching solution, the inorganic acid being one or more of nitric acid, sulfuric acid, and/or hydrochloric acid, a surfactant in an amount of about 0.0001% to about 5% by weight of the etching solution, the nonionic surfactant including one or more of alkylphenol ethoxylate and/or ammonium lauryl sulfate, and water.

8 Claims, No Drawings

WET ETCHING SOLUTION

BACKGROUND OF THE INVENTION

1. Field of the Invention

Embodiments of the present invention relate to a wet etching solution. More specifically, embodiments of the present invention relate to a wet etching solution having an improved oxide selectivity.

2. Description of the Related Art

In general, semiconductor devices and display devices, e.g., liquid crystal displays (LCDs), organic light-emitting diode (OLED) displays, plasma display panels (PDPs), and so forth, may be fabricated by, e.g., photolithography. Photolithography may include several processes, e.g., etching.

Etching refers to a process of removing predetermined portions of material by wet etching, i.e., removal of material via application of a chemical, or by dry etching, i.e., removal of material via plasma. As opposed to dry etching, wet etching may be isotropic, i.e., removal of material in all directions at the same rate, thereby being suitable for use in three-dimensional devices, e.g., metal wiring or contact holes in a semiconductor device. For example, portions of an oxide layer may be etched to form and/or to expose active regions, e.g., source/drain regions, gate regions, and so forth, on a semiconductor substrate.

Conventional wet etching may include a buffered oxide etchant (BOE), e.g., a diluted hydrofluoric acid (HF) solution containing ammonium fluoride. However, conventional wet etchants may have low oxide selectivity, i.e., a ratio between etching rates of different materials, thereby causing incorrect etching of the oxide materials and of structures adjacent thereto, e.g., a metal silicide ($MSi_x$) gate stack. In other words, application of a conventional wet etching solution to an oxide material may cause excessive etching of elements adjacent thereto, thereby damaging the adjacent elements. For example, the conventional BOE may have a very high etching ratio of metal silicide to silicon oxide, e.g., remove portions of metal wiring about five to ten times faster than portions of the oxide material.

SUMMARY OF THE INVENTION

Embodiments of the present invention are therefore directed to a wet etching solution, which substantially overcomes one or more of the disadvantages of the related art.

It is therefore a feature of an embodiment of the present invention to provide a wet etching solution exhibiting high oxide selectivity.

At least one of the above and other features and advantages of the present invention may be realized by providing a wet etching solution, including hydrogen fluoride in an amount of about 0.1% to about 3% by weight of the etching solution, an inorganic acid in an amount of about 10% to about 40% by weight of the etching solution, the inorganic acid being one or more of nitric acid, sulfuric acid, and/or hydrochloric acid, a surfactant in an amount of about 0.0001% to about 5% by weight of the etching solution, the surfactant including one or more of alkylphenol ethoxylate and/or ammonium lauryl sulfate, and water. The surfactant may be ammonium lauryl sulfate.

The wet etching solution may exhibit a selectivity ratio of silicon oxide to metal silicide of about 1:0.5 to about 1:3. The metal silicide may include one or more of tungsten silicide, titanium silicide, molybdenum silicide, nickel silicide, tantalum silicide, and/or copper silicide. The silicon oxide may be a boron phosphor silicate glass.

At least one of the above and other features and advantages of the present invention may be further realized by providing a wet etching solution, including an ammonium fluoride in an amount of about 0.1% to about 10% by weight of the etching solution, an organic acid having at least one carboxyl group in an amount of about 60% to about 98% by weight of the etching solution, and water. The organic acid may include one or more of acetic acid, citric acid, glutaric acid, glycolic acid, formic acid, lactic acid, malic acid, maleic acid, oxalic acid, phthalic acid, succinic acid, tartaric acid, and/or propionic acid.

The wet etching solution may exhibit a selectivity ratio of silicon oxide to metal silicide in a range of about 1:0.5 to about 1:3. The metal silicide may include one or more of tungsten silicide, titanium silicide, molybdenum silicide, nickel silicide, tantalum silicide, and/or copper silicide. The silicon oxide may be a boron phosphor silicate glass.

At least one of the above and other features and advantages of the present invention may be also realized by providing a wet etching solution, including hydrogen fluoride in an amount of about 0.1% to about 10% by weight of the etching solution, an ammonium fluoride in an amount of about 0.1% to about 10% by weight of the etching solution, an organic acid having at least one carboxyl group in an amount of about 30% to about 50% by weight of the etching solution, an alcohol in an amount of about 30% to about 50% by weight of the etching solution, and water. The organic acid may include one or more of acetic acid, citric acid, glutaric acid, glycolic acid, formic acid, lactic acid, malic acid, maleic acid, oxalic acid, phthalic acid, succinic acid, tartaric acid, and/or propionic acid. The alcohol may include one or more of methanol, ethanol, butanol, and/or isopropyl alcohol.

The wet etching solution may exhibit a selectivity ratio of a silicon oxide to metal silicide in a range of about 1:1 to about 1:3. The metal silicide may include one or more of tungsten silicide, titanium silicide, molybdenum silicide, nickel silicide, tantalum silicide, and/or copper silicide. The silicon oxide may be a boron phosphor silicate glass.

DETAILED DESCRIPTION OF THE INVENTION

Korean Patent Application No. 10-2006-0078818, filed on Aug. 21, 2006 in the Korean Intellectual Property Office, and entitled: "Silicon Oxide Selective Wet Etching Solution," is incorporated by reference herein in its entirety.

Hereinafter, exemplary embodiments of a wet etching solution according to the present invention will be described in more detail. The wet etching solution according to embodiments of the present invention may provide high oxide selectivity. In this respect, it is noted that "selectivity" refers to a ratio between different etch rates of an etching solution with respect to different materials, so that "high selectivity of oxides" refers to a high etching rate of oxides, as compared to other materials, e.g., metal silicides. For example, an etching solution exhibiting high selectivity of oxides with respect to metal silicides may remove portions of oxides faster than portions of metal silicides.

Oxides may include silicon oxides, e.g., silicon dioxides, phosphorus-doped silicon glass (PSG), boron and phosphorus doped silicon glass (BPSG), boron-doped silicon glass (BSG), and so forth. Metal silicides may include, e.g., tungsten silicide ($WSi_x$), titanium silicide ($TiSi_x$), molybdenum silicide ($MoSi_x$), nickel silicide ($NiSi_x$), tantalum silicide ($TaSi_x$), and copper silicide ($CuSi_x$), and so forth.

The wet etching solution according to an embodiment of the present invention may include about 0.1% to about 3% by weight of hydrogen fluoride (HF), about 10% to about 40% by weight of an inorganic acid, about 0.0001% to about 5% by weight of a surfactant, and water. Unless indicated otherwise, all percentages refer hereinafter to weight percentages based on a total weight of the wet etching solution.

Weight percentages of compounds described herein, e.g., hydrogen fluoride, inorganic acid, and surfactant, refer to pure, non-aqueous amounts of each of the components. For example, 2% by weight of hydrogen fluoride refers solely to an amount of pure hydrogen fluoride in the wet etching solution. In a case that hydrogen fluoride is used as an aqueous solution, an amount of water in the aqueous hydrogen fluoride is not to be included in the 2%. Further, weight percentages of water in the wet etching solution refer to water added as a remainder to balance the total weight percentage of the wet etching solution, plus any water included in other components of the wet etching solution, e.g., aqueous hydrogen fluoride, aqueous inorganic acid, and/or aqueous nonionic surfactant, in a case that such aqueous solutions are employed. For example, 80% by weight water may refer to 60% by weight of water added to the wet etching solution and to 20% by weight of water included in aqueous components of the wet etching solution.

The hydrogen fluoride of the wet etching solution may increase oxide selectivity, thereby minimizing an etching rate of non-oxide components, e.g., metal silicides.

The inorganic acid of the wet etching solution may include one or more of nitric acid ($HNO_3$), sulfuric acid ($H_2SO_4$), hydrochloric acid (HCl), and/or phosphoric acid ($H_3PO_4$), etc. For example, use of nitric acid may increase etching selectivity of silicon oxide relative to metal silicide.

The surfactant of the wet etching solution may include, e.g., alkylphenol ethoxylate, and/or ammonium lauryl sulfate (ALS), etc. The surfactant may be a nonionic surfactant may include both a hydrophilic group and a lipophilic group, thereby exhibiting miscibility in a larger number of components, as compared to ionic surfactants. As such, the surfactant may exhibit enhanced miscibility in the wet etching solution of the present invention, as compared to conventional wet etching solutions.

In another embodiment of the present invention, the wet etching solution may include about 0.1% to about 10% by weight of an ammonium fluoride, about 60% to about 98% by weight of an organic acid having at least one carboxyl group, and water.

The ammonium fluoride may increase oxide selectivity, thereby minimizing an etching rate of the metal silicide layer.

The organic acid may include one or more of acetic acid ($C_2H_4O_2$), citric acid ($C_6H_8O_7$), glutaric acid ($C_5H_8O_4$), glycolic acid ($C_2H_4O_3$), formic acid ($CH_2O_2$), lactic acid ($C_3H_6O_3$), malic acid ($C_4H6O_5$), maleic acid ($C_4H_4O_4$), oxalic acid ($C_2H_2O_4$), phthalic acid ($C_8H_6O_4$), succinic acid ($C_4H_6O_4$), tartaric acid ($C_4H_6O_6$), and/or propionic acid ($C_3H_6O_2$), etc. Use of the organic acid may minimize formation of particles on a surface of a semiconductor substrate upon application of the wet etching solution thereto.

In yet another embodiment of the present invention, the wet etching solution may include about 0.1% to about 10% by weight of hydrofluoric acid, about 0.1% to about 10% by weight of ammonium fluoride, about 30% to about 50% by weight of organic acid having at least one carboxyl group, about 30% to about 50% by weight of alcohol, and the remainder water.

Weight percentages of compounds described herein refer to pure, non-aqueous amounts of each of the components as described previously with respect to the first embodiment. Further, weight percentages of water in the wet etching solution refer to water added as a remainder to balance the total weight percentage of the wet etching solution, plus any water included in other components of the wet etching solution.

The organic acid may include one or more of acetic acid ($C_2H_4O_2$), citric acid ($C_6H_8O_7$), glutaric acid ($C_5H_8O_4$), glycolic acid ($C_2H_4O_3$), formic acid ($CH_2O_2$), lactic acid ($C_3H_6O_3$), malic acid ($C_4H6O_5$), maleic acid ($C_4H_4O_4$), oxalic acid ($C_2H_2O_4$), phthalic acid ($C_8H_6O_4$), succinic acid ($C_4H_6O_4$), tartaric acid ($C_4H_6O_6$), and/or propionic acid ($C_3H_6O_2$), etc.

The alcohol may include one or more of methanol, ethanol, butanol, and/or isopropyl alcohol, etc. The use of alcohol may minimize wetting of the surface of a semiconductor substrate, thereby decreasing the etching rate of the substrate and reducing formation of particles thereon.

EXAMPLES

Nine (9) wet etching solutions were prepared according to embodiments of the present invention, i.e., Examples 1-9. Additionally, ten (10) comparative wet etching solutions were prepared, i.e., Comparative Examples 1-10. Examples 1-3 were prepared according to the first embodiment, Examples 4-7 were prepared according to the second embodiment, and Examples 8-9 were prepared according to the third embodiment.

Each wet etching solution was evaluated in terms of its etching rate. In particular, each wet etching solution was used to etch a boron phosphor silicate glass (BPSG) layer having an initial thickness of 9,000 angstroms and a titanium silicide ($TiSi_x$) layer having an initial thickness of 1,000 angstroms. The layers used were blanket layers.

Each layer was dipped separately in the wet etching solution for 4 min. Next, a thickness of each layer was measured to determine a thickness difference with respect to a respective initial thickness. The thickness difference was converted to an etch rate expressed in angstroms/min. The results are reported in Tables 1-3, which refer to wet etching solutions prepared according to the first, second, and third embodiments, respectively.

Example 1 a wet etching solution was prepared to include 0.2 wt % of HF, 25 wt % of $HNO_3$, 0.1 wt % of ALS (Fluka), and the remainder water, and was evaluated in terms of etch rate.

Example 2 a wet etching solution was prepared to include 1 wt % of HF, 10 wt % of $HNO_3$, 1 wt % of ALS, and the remainder water, and was evaluated in terms of etch rate.

Example 3 a wet etching solution was prepared and evaluated according to the process described in Example 2, with the exception of using 5 wt % of ALS.

Comparative Example 1 a wet etching solution was prepared to include a conventional HF solution containing ammonium fluoride and a surfactant, i.e. buffered oxide etchant (BOE). The wet etching solution was evaluated in terms of etch rate.

Comparative Example 2 a wet etching solution was prepared and evaluated according to the process described in Example 2, with the exception of using no $HNO_3$.

Comparative Example 3 a wet etching solution was prepared and evaluated according to the process described in Example 2, with the exception of using ethylene glycol (EG) as a solvent instead of water. The wet etching solution contained EG in an amount of at least 80 wt % based on the total weight of the etching solution.

Comparative Example 4 a wet etching solution was prepared and evaluated according to the process described in Example 2, with the exception of using Synperonic PE/L64® (Uniqema, Inc., UK) as a surfactant, instead of ALS.

The results of Examples 1-3 and Comparative Examples 1-4 are reported in Table 1 below.

TABLE 1

Wet Etching Solutions According to the First Embodiment

| Ex. No. | Etching rate of $TiSi_x$ layer (Å/min) | Etching rate of BPSG layer (Å/min) | Etching ratio ($TiSi_x$:BPSG) |
|---|---|---|---|
| Example 1 | 200 | 100 | 2:1 |
| Example 2 | 700 | 300 | 2.33:1 |
| Example 3 | 700 | 250 | 2.8:1 |
| Comp. Example 1 | 2,000 | 200 | 10:1 |
| Comp. Example 2 | 1,000 | 55 | 18.18:1 |
| Comp. Example 3 | 600 | 150 | 4:1 |
| Comp. Example 4 | 680 | 150 | 4.53:1 |

Referring to Table 1, wet etching solutions of Comparative Examples 1-4 exhibited a selectivity ratio of the $TiSi_x$ layer to the BPSG layer of about 10:1, 18.18:1, 4:1, and 4.53:1, respectively. On the other hand, all the wet etching solutions prepared according to an embodiment of the present invention, i.e., Examples 1-3, exhibited an etching rate of the $TiSi_x$ layer to the BPSG layer as a ratio of about 2:1, 2.33:1, and 2.8:1, respectively. These results indicate that the wet etching solutions according to the present invention have a higher etching selectivity for the silicon oxide layer, as compared to those of the wet etching solutions of Comparative Examples 1-4.

Example 4 a wet etching solution was prepared to include 2 wt % of ammonium fluoride, 90 wt % of acetic acid, and 8 wt % of water, and was evaluated in terms of etch rate.

Example 5 a wet etching solution was prepared to include 1 wt % of ammonium fluoride, 98 wt % by weight of acetic acid, and 1 wt % of water, and was evaluated in terms of etch rate.

Example 6 a wet etching solution was prepared and evaluated according to the process described in Example 5, with the exception of using formic acid instead of acetic acid.

Example 7 a wet etching solution was prepared and evaluated according to the process described in Example 5, with the exception of using propionic acid instead of acetic acid.

Comparative Example 5 a wet etching solution was prepared and evaluated according to the process described in Comparative Example 1.

Comparative Example 6 a wet etching solution was prepared and evaluated according to the process described in Example 4, with the exception of using no acetic acid.

Comparative Example 7 a wet etching solution was prepared and evaluated according to the process described in Example 4, with the exception of using hydrochloric acid (HCl) instead of the acetic acid.

The results of Examples 4-7 and Comparative Examples 5-7 are shown in Table 2 below.

TABLE 2

Wet Etching Solutions According to the Second Embodiment

| Ex. No. | Etching rate of $TiSi_x$ layer (Å/min) | Etching rate of BPSG layer (Å/min) | Etching ratio ($TiSi_x$:BPSG) |
|---|---|---|---|
| Example 4 | 620 | 280 | 2.21:1 |
| Example 5 | 200 | 258 | 0.76:1 |
| Example 6 | 983 | 421 | 2.33:1 |
| Example 7 | 1,203 | 530 | 2.27:1 |
| Comp. Example 5 | 2,000 | 200 | 10:1 |
| Comp. Example 6 | 1,000 | 55 | 18.18:1 |
| Comp. Example 7 | 2,800 | 480 | 5.83:1 |

Referring to Table 2, the wet etching solutions of Comparative Examples 4-7, exhibited an etching rate of the $TiSi_x$ layer to the BPSG layer of about 10:1, 18.18:1, and 5.83:1, respectively. On the other hand, wet etching solutions prepared according to the present invention, i.e., Examples 4-6, exhibited an etching rate of the $TiSi_x$ layer to the BPSG layer of about 2.21:1, 0.76:1, 2.33:1, and 2.27:1, respectively. These results indicate that wet etching solutions according to the present invention have a higher etching selectivity for the silicon oxide layer, as compared to those of the wet etching solutions of Comparative Examples 5-7.

Example 8 a wet etching solution was prepared to include 0.3 wt % of hydrofluoric acid, 2 wt % of ammonium fluoride, 48 wt % of acetic acid, 48 wt % of isopropyl alcohol, and the remainder water, and was evaluated in terms of etch rate.

Example 9 a wet etching solution was prepared and evaluated according to the process of Example 8, with the exception of using methanol instead of isopropyl alcohol.

Comparative Example 8 a wet etching solution was prepared and evaluated according to the process of Comparative Example 1.

Comparative Example 9 a wet etching solution was prepared and evaluated according to the process of Example 8, with the exception of using no acetic acid, i.e., water was added in an amount corresponding to the acetic acid.

Comparative Example 10 a wet etching solution was prepared and evaluated according to the process of Example 8, with the exception of using hydrochloric acid instead of acetic acid.

Results of Examples 8-9 and Comparative Examples 8-10 are shown in Table 3 below.

TABLE 3

Wet Etching Solutions According to the Third Embodiment

| Ex. No. | Etching rate of TiSi$_x$ layer (Å/min) | Etching rate of BPSG layer (Å/min) | Etching ratio (TiSi$_x$:BPSG) |
|---|---|---|---|
| Example 8 | 510 | 300 | 1.7:1 |
| Example 9 | 800 | 210 | 3.81:1 |
| Comp. Example 8 | 2,000 | 200 | 10:1 |
| Comp. Example 9 | 1,000 | 55 | 18.18:1 |
| Comp Example 10 | 2,800 | 480 | 5.83:1 |

Referring to Table 3, the wet etching solutions of Comparative Examples 8-10 exhibited an etching ratio of the TiSi$_x$ layer to the BPSG layer of about 10:1, 18.18:1, and 5.83:1, respectively. On the other hand, wet etching solutions prepared according to an embodiment of the present invention, i.e., Examples 8-9, exhibited an etching ratio of the TiSi$_x$ layer to the BPSG layer of about 1.7:1 and 3.81:1, respectively. These results indicate that wet etching solutions according to the present invention may have high etching selectivity for the silicon oxide layer, as compared to those of the wet etching solutions of Comparative Examples 8-10.

The wet etching solutions according to embodiments of the present invention may be advantageous in providing a higher selectivity for oxides relative to, e.g., metal silicide, as compared to conventional wet etching solutions. Accordingly, wet etching solutions according to embodiments of the present invention may facilitate faster and more efficient removal of silicon oxide portions, e.g., at least two times (2×) faster, without causing substantial damage to adjacent non-oxide elements, e.g., titanium silicide elements, as compared to, e.g., Comparative Examples 1-10. Further, the wet etching solutions according to embodiments of the present invention may exhibit superior etch selectivity for BPSG.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A wet etching solution, comprising:
   hydrogen fluoride in an amount of about 0.1% to about 10% by weight of the etching solution;
   an ammonium fluoride in an amount of about 0.1% to about 10% by weight of the etching solution;
   an organic acid having at least one carboxyl group in an amount of about 30% to about 50% by weight of the etching solution;
   an alcohol in an amount of about 30% to about 50% by weight of the etching solution; and
   water.

2. The wet etching solution as claimed in claim 1, wherein the organic acid includes one or more of acetic acid, citric acid, glutaric acid, glycolic acid, formic acid, lactic acid, malic acid, maleic acid, oxalic acid, phthalic acid, succinic acid, tartaric acid, and/or propionic acid.

3. The wet etching solution as claimed in claim 1, wherein the alcohol includes one or more of methanol, ethanol, butanol, and/or isopropyl alcohol.

4. The wet etching solution as claimed in claim 1, wherein the wet etching solution exhibit a selectivity ratio of a silicon oxide to metal silicide in a range of about 1:1 to about 1:3.

5. The wet etching solution as claimed in claim 1, wherein the wet etching solution exhibits a selectivity ratio of silicon oxide to each of tungsten silicide, titanium silicide, molybdenum silicide, nickel silicide, tantalum silicide, and copper silicide, of about 1:0.5 to about 1:3.

6. The wet etching solution as claimed in claim 1, wherein the wet etching solution exhibits a selectivity ratio of boron phosphor silicate glass to metal silicide of about 1:0.5 to about 1:3.

7. The wet etching solution as claimed in claim 1, wherein the water in the wet etching solution is in an amount substantially equal to a remainder of a total weight of the wet etching solution including the hydrogen fluoride, the ammonium fluoride, the organic acid, and the alcohol.

8. A method for selectively etching a silicon oxide layer using the wet etching solution according to claim 1.

* * * * *